(12) United States Patent
Obata

(10) Patent No.: US 12,529,139 B2
(45) Date of Patent: Jan. 20, 2026

(54) SHOWER PLATE AND FILM DEPOSITION APPARATUS

(71) Applicant: Tokyo Electron Limited, Tokyo (JP)

(72) Inventor: Yuji Obata, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 510 days.

(21) Appl. No.: 18/000,440

(22) PCT Filed: Jun. 2, 2021

(86) PCT No.: PCT/JP2021/020988
§ 371 (c)(1),
(2) Date: Dec. 1, 2022

(87) PCT Pub. No.: WO2021/256260
PCT Pub. Date: Dec. 23, 2021

(65) Prior Publication Data
US 2023/0212748 A1    Jul. 6, 2023

(30) Foreign Application Priority Data
Jun. 15, 2020   (JP) ................. 2020-103131

(51) Int. Cl.
*H01J 37/32*    (2006.01)
*C23C 16/34*    (2006.01)
(Continued)

(52) U.S. Cl.
CPC ........ *C23C 16/45565* (2013.01); *C23C 16/34* (2013.01); *C23C 16/448* (2013.01);
(Continued)

(58) Field of Classification Search
CPC . C23C 16/45565; C23C 16/34; C23C 16/448; C23C 16/45544; C23C 16/45574;
(Continued)

(56) References Cited

U.S. PATENT DOCUMENTS 5,316,796 A  *  5/1994  Awaya .............. C23C 16/45565
                                                    427/255.28
2002/0005442 A1 *  1/2002  Watanabe ......... H01L 21/67017
                                                    239/548

(Continued)

FOREIGN PATENT DOCUMENTS

JP    2002-510877    4/2002
JP    2011-086776    4/2011
(Continued)

*Primary Examiner* — Rodney G Mcdonald
(74) *Attorney, Agent, or Firm* — IPUSA, PLLC

(57) ABSTRACT

A shower plate that includes a plate-like member provided at a top of a processing chamber is provided. The shower plate has first holes communicating with a first flow path in the shower plate. The shower plate includes first chamber valves provided with the respective first holes. The shower plate has second holes communicating with a second flow path in the shower plate. The shower plate includes second chamber valves provided with the respective second holes. The shower plate has third holes provided in the plate-like member to correspond to the first holes and the second holes. The shower plate includes third chamber valves provided with the respective third holes. The first chamber valves, the second chamber valves, and the third chamber valves are piezoelectric elements.

10 Claims, 3 Drawing Sheets

(51) Int. Cl.
  *C23C 16/448* (2006.01)
  *C23C 16/455* (2006.01)
  *H01L 21/285* (2006.01)
  *H01L 23/00* (2006.01)

(52) U.S. Cl.
  CPC .... *H01J 37/3244* (2013.01); *H01J 37/32449* (2013.01); *H01L 21/285* (2013.01); *H01L 24/31* (2013.01)

(58) Field of Classification Search
  CPC ....... C23C 16/52; H01L 21/285; H01L 21/31; H01J 37/3244; H01J 37/32449
  USPC ........................................................ 118/715
  See application file for complete search history.

(56) References Cited

U.S. PATENT DOCUMENTS

2004/0040502 A1* 3/2004 Basceri ............. C23C 16/45574
                                                                 118/715
2004/0040503 A1   3/2004 Basceri et al.
2015/0221508 A1*  8/2015 Kurita ................ H10D 30/6713
                                                                 118/723 R

FOREIGN PATENT DOCUMENTS

KR   10-2020-0012128   2/2020
WO     1999/052133   10/1999

\* cited by examiner

SHOWER PLATE AND FILM DEPOSITION APPARATUS

TECHNICAL FIELD

The present disclosure relates to a shower plate and a film deposition apparatus.

BACKGROUND ART

For example, Patent Document 1 proposes providing multiple piezoelectric valves in a shower plate and supplying the gas containing reactant species to a reaction processing chamber through the piezoelectric valves.

For example, Patent Document 2 proposes providing a piezo valve in a buffer chamber that is situated directly on a shower plate.

RELATED-ART DOCUMENTS

Patent Document

[Patent Document 1] Japanese Translation of PCT International Publication No. 2002-510877
[Patent Document 2] Japanese Unexamined Patent Application Publication No. 2011-086776

SUMMARY

Problem to be Solved by the Invention

The present disclosure provides a technique capable of storing the gas in a shower plate.

According to an aspect of the present disclosure, a shower plate that includes a plate-like member provided at a top of a processing chamber is provided. The shower plate has first holes communicating with a first flow path in the shower plate. The shower plate includes first chamber valves provided with the respective first holes. The shower plate has second holes communicating with a second flow path in the shower plate. The shower plate includes second chamber valves provided with the respective second holes. The shower plate has third holes provided in the plate-like member to correspond to the first holes and the second holes. The shower plate includes third chamber valves provided with the respective third holes. The first chamber valves, the second chamber valves, and the third chamber valves are piezoelectric elements.

Effect of the Invention

According to one aspect, a gas is capable of being retained in a shower plate.

DESCRIPTION OF EMBODIMENTS

Figure 1:
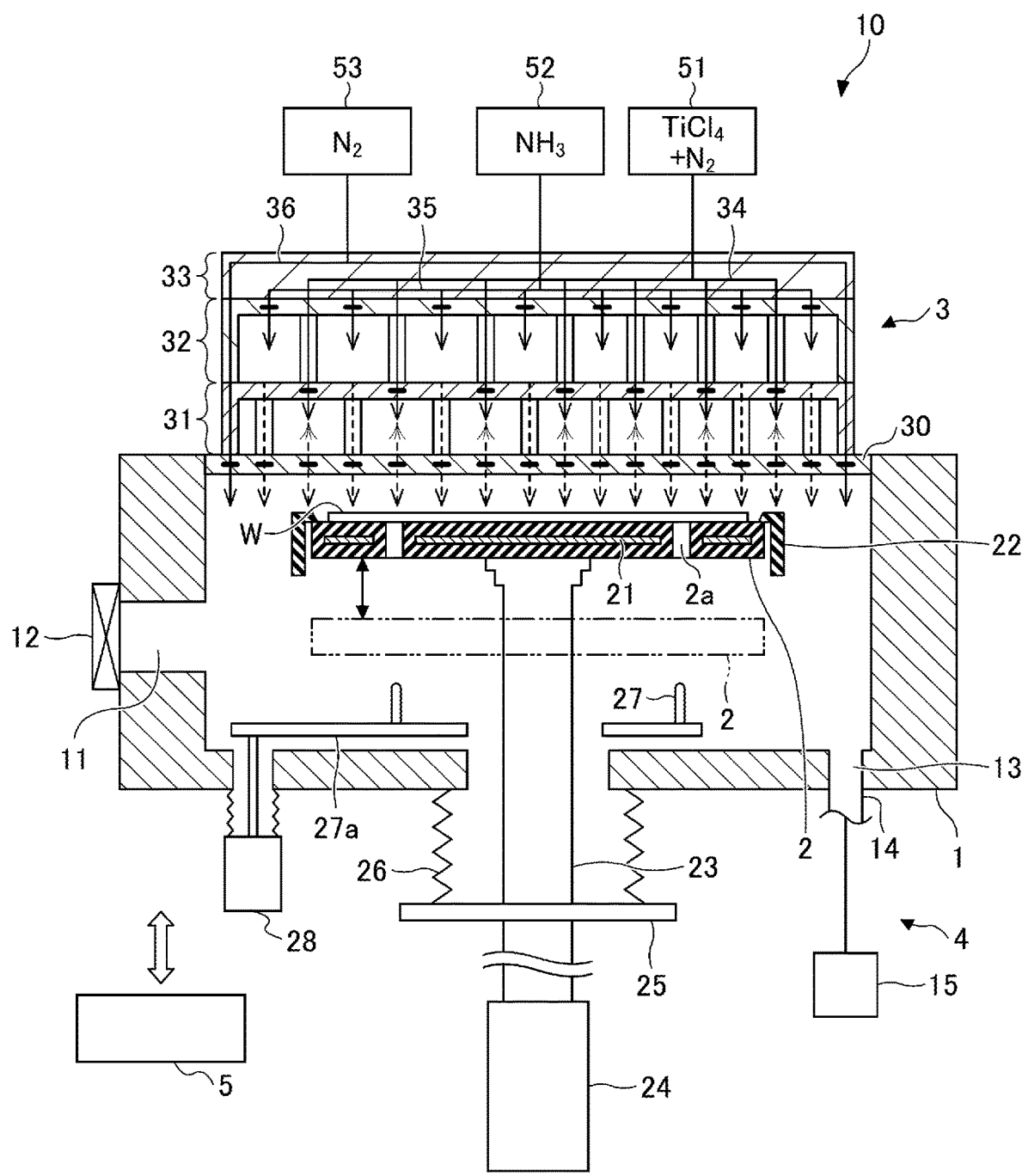
FIG. 1 is a schematic cross-sectional view of a film deposition apparatus according to an embodiment.

Embodiments of the present disclosure will be described below with reference to the drawings. In the drawings, the same components are denoted by the same numerals, and redundant description thereof may be omitted.

[Film Deposition Apparatus]

First, the configuration of a film deposition apparatus 10 according to an embodiment will be described with reference to FIG. 1. FIG. 1 is a schematic cross-sectional view of the film deposition apparatus 10 according to the embodiment. The film deposition apparatus 10 according to the embodiment is an example of a film deposition apparatus 10 that forms a TiN film by atomic layer deposition (ALD) or chemical vapor deposition (CVD) in a processing chamber that is in a depressurized state. However, the film deposition apparatus 10 according to the embodiment is not limited to forming the TiN film and can form a desired film in accordance with process gas that is supplied.

The film deposition apparatus 10 includes a processing chamber 1, a stage 2, a shower plate 3, an exhausting unit 4, and a controller 5. The processing chamber 1 is made of metal such as aluminum, and has a substantially cylindrical shape. The processing chamber 1 accommodates a substrate W. A loading port 11 for loading or unloading the substrate W is formed at the sidewall of the processing chamber 1, and a gate valve 12 opens and closes the loading port 11.

The stage 2 horizontally supports the substrate W in the processing chamber 1. The stage 2 is formed in a disk shape having the size that corresponds to the substrate W. The stage 2 is made of a ceramic material such as aluminum nitride (AlN), or of a metal material such as aluminum or a nickel alloy. A heater 21 for heating the substrate W is embedded in the stage 2. A heater power source supplies power to the heater 21 and thus the heater 21 generates heat. The output of the heater 21 is controlled based on a temperature signal from a thermocouple that is provided proximal to the top surface of the stage 2, so that the temperature of the substrate W is adjusted to a predetermined temperature. A cover member 22, which is formed of ceramics such as alumina so as to cover both an outer peripheral region of the top surface of the stage 2 and a side surface of the stage 2, is provided with respect to the stage 2.

The stage 2 is supported by a support member 23. The support member 23 extends from a central portion of the bottom surface of the stage 2, passes through a hole that is formed in a bottom wall of the processing chamber 1, and extends below the processing chamber 1. A bottom end of the support member 23 is coupled to an elevating mechanism 24. The elevating mechanism 24 raises and lowers the stage 2 through the support member 23 to be situated between a process position as illustrated in FIG. 1 and a transfer position to which the substrate W can be transferred, as indicated by the chain double-dashed line, and the transfer position is situated below the process position. A flange 25 is attached to the support member 23, below the processing chamber 1. A bellows 26 is provided between the bottom surface of the processing chamber 1 and the flange 25 to separate an atmosphere in the film deposition apparatus 10 from the outside air. The bellows 26 expands and contracts in accordance with an elevating motion of the stage 2.

Support pins 27 are provided proximal to the bottom surface of the processing chamber 1 so as to protrude upward from an elevating plate 27a. The support pins 27 are raised and lowered through the elevating plate 27a by an elevating mechanism 28 that is provided below the processing chamber 1. The support pins 27 are corresponding inserted through through-holes 2a that are provided in the stage 2 that is at the transfer position, and thus the support pins 27 can be protruded from and retracted into the top surface of the stage 2. By raising and lowering the support pins 27, the substrate W is transferred between a transfer mechanism, not illustrated, and the stage 2.

The shower plate 3 is provided at the top of the processing chamber 1, and supplies each of process gas (a source gas and a reducing gas) and a purge gas to the processing chamber 1 such that the supplied gas is showered. The shower plate 3 includes a plate-like member 30 that faces the stage 2. The plate-like member 30 has the diameter greater than the diameter of the stage 2, and is a disk-shaped plate that is made of metal or ceramic. The plate-like member 30 is a portion of the shower plate 3 and also serves as a ceiling wall of the processing chamber 1.

The shower plate 3 includes a first buffer-tank plate 31 that is laminated directly on the plate-like member 30, and the first buffer-tank plate 31 has the shape of a hollow plate and incorporates a vaporization chamber. Also, the shower plate 3 includes a second buffer-tank plate 32 that has the shape of a hollow plate and is laminated directly on the first buffer-tank plate 31, and includes a top member 33 that is laminated directly on the second buffer-tank plate 32.

In an interior of the top member 33, flow paths of a source gas line 34, a reducing gas line 35, and a purge gas line 36 are formed. The plate-like member 30, the first buffer-tank plate 31, the second buffer-tank plate 32, and the top member 33 are disk-like plates that are concentrically arranged to have the same diameter.

$TiCl_4$ and $N_2$ gas are supplied from a source gas supply 51 to the first buffer-tank plate 31 through the source gas line 34. The $TiCl_4$ is liquid.

$NH_3$ gas is supplied from a reducing gas supply 52 to the second buffer-tank plate 32 through the reducing gas line 35. The $N_2$ gas as the purge gas from a purge gas supply 53, passes into the top member 33 through the purge gas line 36, then passes into the sidewall of the second buffer-tank plate 32 and the sidewall of the first buffer-tank plate 31, and finally is supplied to the processing chamber 1.

The exhausting unit 4 exhausts the interior of the processing chamber 1. An exhaust port 13 is formed at the bottom of the processing chamber 1. The exhausting unit 4 includes an exhaust pipe 14 that is coupled to the exhaust port 13, and includes an exhausting device 15 that is coupled to the exhaust pipe 14, and the exhausting device 15 includes a vacuum pump, a pressure control valve, and the like. During the process, the exhausting device 15 exhausts the gas in the processing chamber 1 through the exhaust pipe 14 coupled to the exhaust port 13.

The controller 5 controls the overall operation of the film deposition apparatus 10 as configured as described above. The controller 5 is implemented, for example, by a computer, and includes a central processing unit (CPU), a random access memory (RAM), a read only memory (ROM), an auxiliary storage device, and the like. The CPU operates based on a program that is stored in the ROM or the auxiliary storage device to control the operation of the entire apparatus. The controller 5 may be provided inside or outside the film deposition apparatus 10. When the controller 5 is provided externally, the controller 5 can control the film deposition apparatus 10 by a communication system such as wired or wireless.

[Shower Plate]

Figure 2:
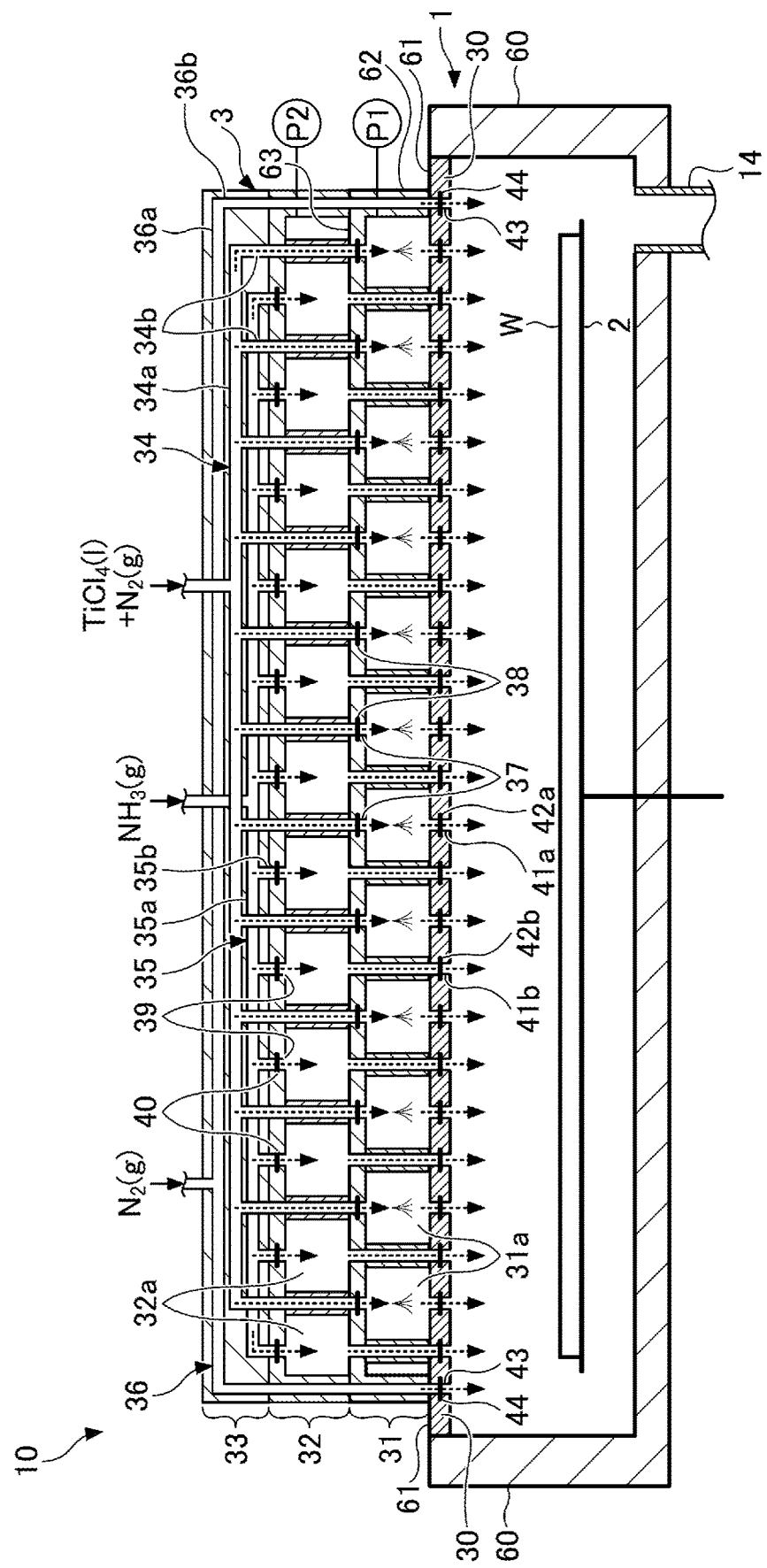
FIG. 2 is an enlarged view of a shower plate 3 that is disposed in the film deposition apparatus illustrated in FIG. 1.

Hereafter, the configuration of the shower plate 3 will be further described with reference to FIG. 2. FIG. 2 is an enlarged view of the shower plate 3 disposed in the film deposition apparatus 10 as illustrated in FIG. 1.

The shower plate 3 has first holes 37 that corresponding communicate with vertical lines 34a, which branch vertically from a horizontal line 34b of the source gas line 34 that is a flow path in the top member 33. The first holes 37 are formed at the top of the first buffer-tank plate 31. The source gas line 34 is an example of a first flow path in the shower plate 3. First chamber valves 38 are arranged so as to correspond to the first holes 37 in a relation of 1:1. The first chamber valves 38 are provided in the first buffer-tank plate 31.

When the $TiCl_4$ of a source material and the $N_2$ gas of carrier gas are carried through the source gas line 34, and then the first chamber valves 38 are opened, the $TiCl_4$ and the $N_2$ gas are supplied, via the first holes 37, to the first buffer-tank plate 31 that is segmented into multiple sections.

A heater 62 for vaporizing the liquid $TiCl_4$, as well as a pressure gauge P1 for measuring the pressure of the vaporized $TiCl_4$ gas, are provided in the first buffer-tank plate 31. The heater 62 heats and vaporizes the $TiCl_4$ in the first buffer-tank plate 31, and thus the $TiCl_4$ gas at a constant pressure is retained in the first buffer-tank plate 31. With this arrangement, the first buffer-tank plate 31 incorporates the vaporization chamber in which the $TiCl_4$ is vaporized, and serves as a tank that retains the $TiCl_4$ gas.

The first buffer-tank plate 31 may not incorporate a vaporization chamber. In this case, it is necessary to turn $TiCL_4$ to a gaseous state outside the shower plate 3 and to then supply it to the first buffer-tank plate 31. In view of such a situation, as described in the present embodiment, preferably, the first buffer-tank plate 31 has the shape of the hollow plate and is a tank incorporating a vaporization chamber.

The shower plate 3 has second holes 39 that communicate with corresponding vertical lines 35a, which branch vertically from a horizontal line 35b of the reducing gas line 35 that is a flow path in the top member 33. The second holes 39 are formed at the top of the second buffer-tank plate 32. The reducing gas line 35 is an example of a second flow path in the shower plate 3. Second chamber valves 40 are arranged so as to correspond to the second holes 39 in a relation of 1:1. The second chamber valves 40 are provided in the second buffer-tank plate 32.

When the $NH_3$ gas of the reducing gas is carried through the reducing gas line 35, and then the second chamber valves 40 are opened, the $NH_3$ gas is supplied, via the second holes 39, to the second buffer-tank plate 32 that is segmented into multiple sections.

An insulation sheet 63 is provided between the first buffer-tank plate 31 and the second buffer-tank plate 32. The insulation sheet 63 suppresses the transfer, to the second buffer-tank plate 32, of heat from the first buffer-tank plate 31, the plate-like member 30, and the processing chamber 1, heated by the heaters 62, 61, and 60, respectively. With this arrangement, increases in the temperature of the second buffer-tank plate 32 can be suppressed, and thus the $NH_3$ gas can be prevented from being heated. However, the shower plate 3 may not include the insulation sheet 63.

On a $TiCl_4$ gas-outlet side of the first buffer-tank plate 31, third holes 41a are formed in the plate-like member 30 to correspond to the first holes 37. As in a case where the first chamber valve 38 is provided with respect to each first hole 37, third chamber valves 42a are arranged so as to correspond to the third holes 41a in a relation of 1:1. The third chamber valves 42a are provided in the plate-like member 30.

By opening and closing the first chamber valves 38, the first buffer-tank plate 31 vaporizes $TiCl_4$ that is supplied through the source gas line 34 and the first holes 37, and then retains $TiCl_4$ gas that is vaporized. The $TiCl_4$ gas retained in the first buffer-tank plate 31 is supplied to the processing chamber 1 through the third holes 41a, by opening and closing the third chamber valves 42a.

On an $NH_3$ gas-outlet side of the second buffer-tank plate 32, third holes 41b are formed in the plate-like member 30 to correspond to the second holes 39. As in a case where the second chamber valve 40 is provided with respect to each second hole 39, the third chamber valves 41b are arranged so as to correspond to the third holes 42b in a relation of 1:1. The third chamber valves 42b are provided in the plate-like member 30.

The third holes 41a and the third holes 41b may be collectively referred to as third holes 41. The third chamber valves 42a and the third chamber valves 42b may be collectively referred to as third chamber valves 42. The first chamber valves 38, the second chamber valves 40, and the third chamber valves 42 are piezoelectric elements, and can adjust the opening and closing of each chamber valve, as well as adjusting the degree of an opening of each chamber valve.

By opening and closing the second chamber valves 40, the second buffer-tank plate 32 retains $NH_3$ gas that is supplied through the reducing gas line 35 and the second holes 39. The $NH_3$ gas retained in the second buffer-tank plate 32 is supplied to the processing chamber 1 through the third holes 42b, by opening and closing the third chamber valves 41b.

The first buffer-tank plate 31 is divided into first tanks 31a. Each of the first tanks 31a communicates with at least any one of the first holes 37 and at least any one of the third holes 41a. The $TiCl_4$ gas is supplied to the processing chamber 1 at a flow rate, and the flow rate is controlled based on a timing at which each of a given first chamber valve 38 and a given third chamber valve 42a is opened and closed, as well as on a difference in degree of the opening between the given first chamber valve 38 that is provided with respect to the first hole 37 communicating with each first tank 31a, and the given third chamber valve 41a that is provided with respect to a corresponding third hole 41a.

That is, for each first tank 31a, an inlet-side first chamber valve 38 and an outlet-side third chamber valve 42a serve as a differential pressure-based mass flow controller. The controller 5 adjusts an integrated value of the flow rate of the $TiCl_4$ gas that is supplied from each first tank 31a to the processing chamber 1, based on a timing at which each of the inlet-side first chamber valve 38 and the outlet-side third chamber valve 42a is on and off (opened and closed), as well as on a difference in degree of the opening between those chamber valves 38 and 42a. With this arrangement, for each first tank 31a, the $TiCl_4$ gas is supplied from a given first tank 31a to the processing chamber 1 at a desired flow rate. In other words, an exhausted amount of the gas is controlled by using the inlet-side first chamber valve 38 and the outlet-side third chamber valve 42a that are provided for each first tank 31a.

With this arrangement, each first tank 31a serves as a vaporization chamber in which the source material is vaporized, and temporarily retains $TiCl_4$ gas that is a vaporized source gas. Thus, the $TiCl_4$ gas can be stably supplied to the processing chamber 1 at a flow rate that is relatively great.

The second buffer-tank plate 32 is divided into second tanks 32a. Each of the second tanks 32a communicates with at least any one of second holes 39 and at least any one of third holes 41b. The $NH_3$ gas is supplied to the processing chamber 1 at a flow rate, and the flow rate of the $NH_3$ gas is controlled based on a timing at which each of a given second chamber valve 40 and a given third chamber valve 42b is opened and closed, as well as on a difference in degree of the opening between the given second chamber valve 40, which is provided with respect to the second hole 39 communicating with each second tank 32a, and the given third chamber valve 42b that is provided with respect to a corresponding third hole 41b.

That is, for each second tank 32a, an inlet-side second chamber valve 40 and an outlet-side third chamber valve 42b serve as a differential pressure-based mass flow controller. The controller 5 adjusts an integrated value of the flow rate of the $NH_3$ gas that is supplied from each second tank 32a to the processing chamber 1, based on a timing at which each of the inlet-side second chamber valve 40 and the outlet-side third chamber valve 42b is on and off (opened and closed), as well as on a difference in degree of the opening between those chamber valves 40 and 42b. With this arrangement, for each second tank 32a, the $NH_3$ gas at a desired flow rate is supplied from a given second tank 32a to the processing chamber 1. In other words, an exhausted amount of the gas is controlled by using the inlet-side second chamber valve 40 and the outlet-side third chamber valve 42b that are provided for each second tank 32a.

With this arrangement, each second tank 32a temporarily retains the $NH_3$ gas that is a reducing gas, and thus the $NH_3$ gas can be stably supplied to the processing chamber 1 at a flow rate that is relatively great.

In the present embodiment, an example in which one tank includes one inlet-side valve and one outlet-side valve is described, but it is not limiting. For example, one tank may include multiple inlet-side valves or may include multiple outlet-side valves. In this case as well, the controller 5 controls, for each tank, a timing at which each of one or more inlet-side chamber valves and one or more outlet-side chamber valves is on and off, as well as controlling a difference in degree of the opening between given chamber valves. With this arrangement, a flow rate for each of the source gas and the reducing gas that is supplied from each tank to the processing chamber 1 can be controlled.

The horizontal line 36a of the purge gas line 36 that is formed in the top member 33 is bent in a vertical direction to correspond to the perimeter of the top member 33, and is coupled to the vertical line 36b that is formed on sidewalls of the second buffer-tank plate 32 and the first buffer-tank plate 31. The vertical line 36b communicates with each fourth hole 43 that is formed at the outer periphery of the plate-like member 30. The fourth chamber valves 44 are arranged so as to correspond to the fourth holes 43 in a relation of 1:1. The fourth chamber valves 44 are provided in the plate-like member 30.

The $N_2$ gas is supplied, via the purge gas line 36, to the processing chamber 1 to replace (purge) the gas in the processing chamber 1 with the $N_2$ gas. The controller 5 opens and closes the fourth chamber valves 44, and thus, delivery and termination of the supply of the $N_2$ gas to the processing chamber 1 are controlled.

In the present embodiment, the $N_2$ gas is supplied to the processing chamber 1 through the purge gas line 36, but it is not limiting. For example, the $N_2$ gas may be supplied to the processing chamber 1 through the first buffer-tank plate 31 and/or the second buffer-tank plate 32. Two routes, a route through the first buffer-tank plate 31 and the second buffer-tank plate 32 and another route without using those buffer-tank plates are provided, and at least any one of the two routes may be used to supply the $N_2$ gas to the processing chamber 1. However, the purge gas line 36 according to the present embodiment can supply the $N_2$ gas to the processing chamber 1 independently of the source gas and the reducing gas that is supplied.

In the shower plate 3 described above, the first buffer-tank plate 31 and the second buffer-tank plate 32 are sequentially laminated directly on and above the processing chamber 1, respectively, thereby minimizing a distance between each of the first tank 31a and the second tank 32a and the processing chamber 1. With this arrangement, a quick response to the timing at which each gas is to be supplied is enabled. Thus, the gas in the processing chamber 1 can be quickly replaced by the $TiCl_4$ gas retained in each first tank 31a and the $NH_3$ gas retained in each second tank 32a. Also, the shower plate 3 has a structure in which a distance to the substrate W from each chamber valve that is provided in each of the plate-like member 30, the first buffer-tank plate 31, and the second buffer-tank plate 32, can be minimized. With this arrangement, a piping length of each gas line, via which a given gas among the $TiCl_4$ gas and the $NH_3$ gas is supplied from a corresponding tank to the processing chamber 1, can be minimized. Therefore, effects of residual gas in the piping of each gas line can be minimized.

The piping of the source gas line 34 and the first buffer-tank plate 31 are heated by a heater. With this arrangement, in the present embodiment, by shortening the piping of the source gas line 34, the number of heaters that are installed can be reduced, thereby reducing costs. Also, in the present embodiment, tanks and vaporization chambers are all integrated in the shower plate 3, and thus they need not be provided outside the film deposition apparatus 10. This also results in reduced costs, thereby further resulting in reductions in the footprint of the apparatus.

Also, the first chamber valves 38, the second chamber valves 40, and the third chamber valves 42 are all integrated in the shower plate 3. With this arrangement, an operational range of each chamber valve is reduced under the control of the controller 5, and thus a mechanical operation is rapidly performed. Therefore, the delay of gas supply can be reduced. Also, at a timing at which a desired gas is to be supplied, the gas can be rapidly supplied to the processing chamber 1.

For each tank, a timing at which each of the $TiCl_4$ gas and the $NH_3$ gas that is retained in a corresponding tank among the first tanks 31a and the second tanks 32a is supplied, as well as a flow rate of the corresponding gas, can be individually controlled. With this arrangement, flow distribution of the $TiCl_4$ gas and the $NH_3$ gas can be accurately controlled. Thus, uniformity within a given TiN film that is deposited on the substrate W can be increased.

Further, a given flow rate of the $TiCl_4$ and a given flow rate of the $NH_3$ gas, which are supplied from each tank to the processing chamber 1, can each be controlled based on a timing at which each of the inlet-side chamber valve and the outlet-side chamber valve of a given tank is on and off, as well as on a difference in degree of the opening between the inlet-side chamber valve and the outlet-side chamber valve.

Zonal control for chamber valves can be performed where a timing at which, for each tank in a specific zone, each of a given inlet-side chamber valve and a given outlet-side chamber valve is on and off, as well as the difference in degree of the opening between these chamber valves, are independently controlled. For example, timings at which in the shower plate 3; one or more first chamber valves 38; one or more second chamber valves 40; and one or more third chamber valves 42a and 42b are each on or off, as well as differences in degree of the opening between given chamber valves among the chamber valves 38, 40, and 42a and 42b, are controlled for each zone in which given chamber valves are arranged concentrically. For example, control in which, for chamber valves included on an edge side (edge zone), opening or the like is enabled for a time period longer or shorter than a time period used in a case of given chamber valves that are included in a central side (central zone). For example, zonal control of the opening and closing of each chamber valve may be performed in accordance with exhaust variations from the processing chamber 1 through the exhausting device 15.

[Deposition Method]

Figure 3:
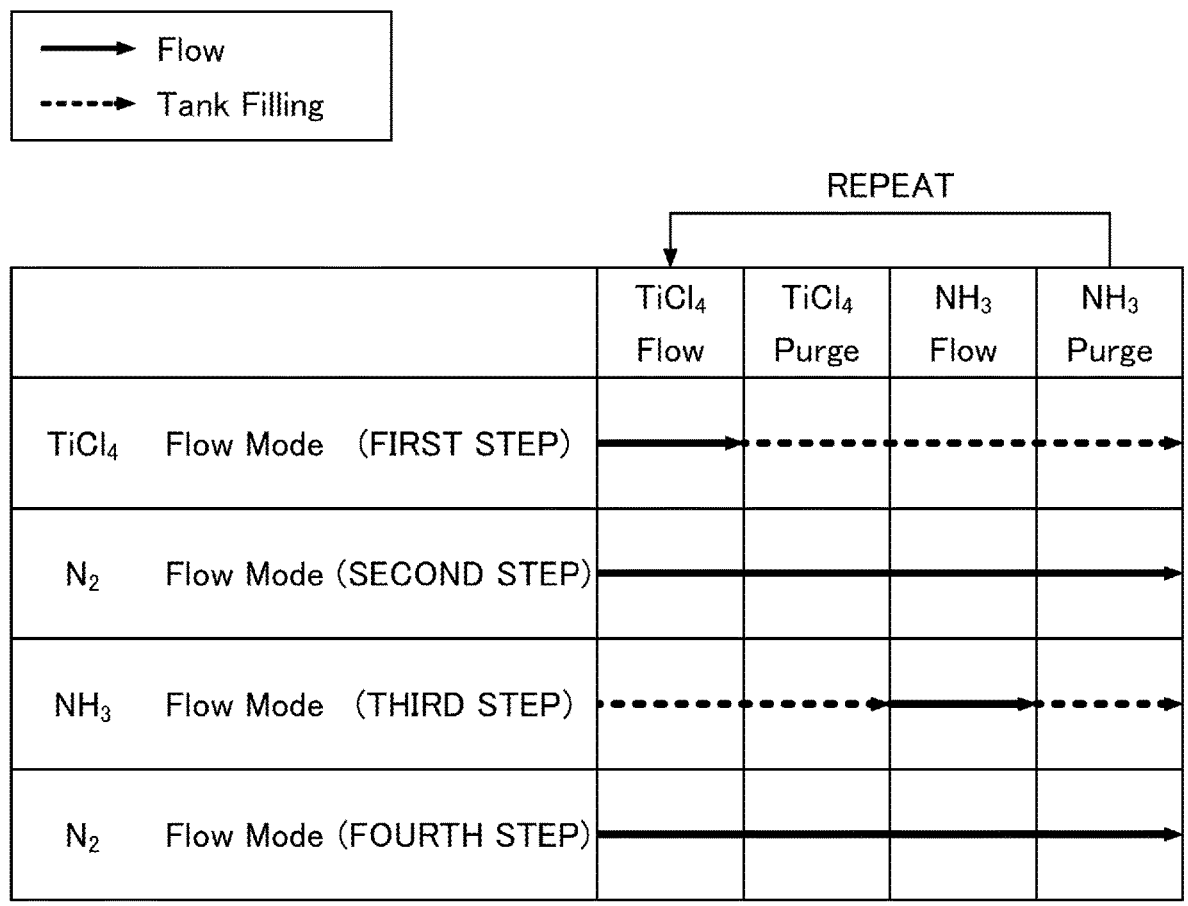
FIG. 3 is a flowchart illustrating the flow of each step in a deposition method according to the embodiment.

Hereafter, with use of the film deposition apparatus 10 that includes the shower plate 3 having the above configuration, a method example of depositing the TiN film by the ALD will be described with reference to FIGS. 2 and 3. FIG. 3 is a flowchart illustrating a flow of each step in a deposition method according to the embodiment. Control in the deposition method as illustrated in FIG. 3 is performed by the controller 5. In an initial state of the film deposition apparatus 10, the first chamber valves 38, the second chamber valves 40, the third chamber valves 42a and 42b, and the fourth chamber valves 44 are all in a closed state within the shower plate 3.

(First Step)

Before the first step, the controller 5 opens all the first chamber valves 38, supplies $TiCl_4$ or both the $TiCl_4$ and $N_2$ gas to the first tanks 31a via the source gas line 34, vaporizes the $TiCl_4$ within each of the first tanks 31a, and retains $TiCl_4$ gas in each first tank 31a.

That is, the $TiCl_4$ and the $N_2$ gas are supplied to each first tank 31a via a corresponding first hole among the first holes 37. The $TiCl_4$ is heated by the heater 62 to be vaporized and is temporarily retained in the first tank 31a as $TiCl_4$ gas. Thus, the pressure in each first tank 31a is increased to a predetermined pressure.

Deliver and termination of the supply of the $TiCl_4$ gas from each first tank 31a to the processing chamber 1 are respectively controlled by opening and closing a corresponding third chamber valve 42a. Also, a given flow rate of the $TiCl_4$ gas that flows into the processing chamber 1 is controlled by a difference in degree of the opening between the first chamber valve 38 and the third chamber valve 42a that are provided for each first tank 31a.

With this arrangement, after the $TiCl_4$ gas is temporarily retained in each first tank 31a and then a desired time period (for example, 0.1 to 10 seconds) elapses, all the third chamber valves 42a are opened. At this time, the flow rate of the $TiCl_4$ gas is controlled based on a difference in pressure between a primary side and a secondary side of each first tank 31a. Thus, the $TiCl_4$ gas, of which a flow rate is controlled to a desired flow rate that is relatively great, can be supplied from each first tank 31a to the processing chamber 1. With this arrangement, the substrate W is exposed to the $TiCl_4$ gas, and thus the $TiCl_4$ gas is adsorbed onto the surface of the substrate W.

At this time, each fourth chamber valve 44 may be in a closed state or in an open state. In the open state, $N_2$ gas at a desired flow rate (for example, 100 to 10000 sccm) is supplied through the purge gas line 36. In the present embodiment, in the first step, each fourth chamber valve 44 is controlled to be in a closed state.

(Second Step)

After a desired time period (for example, 0.1 to 10 seconds) has elapsed since all the third chamber valves 42a are opened in the first step, the controller 5 controls a shift from the first step to a second step. That is, the controller 5 closes all the third chamber valves 42a to terminate the supply of the $TiCl_4$ and the $N_2$ gas to the processing chamber 1. When all the third chamber valves 42a are closed, the $TiCl_4$ and the $N_2$ gas that are supplied from the source gas supply 51 through the source gas line 34 are retained in each of the first tanks 31a, and thus the pressure in each first tank 31a is increased.

The controller 5 also opens all the fourth chamber valves 44. With this arrangement, the $N_2$ gas at a desired flow rate (for example, 100 to 10000 sccm) is supplied, as a purge gas, to the processing chamber 1 through the purge gas line 36, and then the $TiCl_4$ gas is exhausted from the processing chamber 1.

(Third Step)

Before the third step, the controller 5 opens all the second chamber valves 40, supplies the $NH_3$ gas to the second tanks 32a through the reducing gas line 35, and then retains the $NH_3$ gas in each of the second tanks 32a. That is, the $NH_3$ gas is supplied to the second tanks 32a via the respective second holes 39. The $NH_3$ gas is temporarily retained in each of the second tanks 32a, and thus the pressure in each second tank 32a is increased to a predetermined pressure.

After a desired time period (for example, 0.1 to 10 seconds) has elapsed since all the fourth chamber valves 44 are opened in the second step, the controller 5 controls a shift from the second step to a third step. That is, the controller 5 opens all the third chamber valves 42b to control a flow rate of the $NH_3$ gas based on a difference in pressure between a primary side and a secondary side of each second tank 32a. With this arrangement, the $NH_3$ gas that is retained in each second tank 32a is supplied to the processing chamber 1, and thus the $TiCl_4$ gas absorbed onto the surface of the substrate W is reduced. At this time, all the fourth chamber valves 44 may be in a closed state or in an open state. In the open state, subsequently, $N_2$ gas at a desired flow rate (for example, 100 to 10000 sccm) is supplied to the processing chamber 1 through the purge gas line 36. In the present embodiment, in the third step, each fourth chamber valve 44 is controlled to be in a closed state.

(Fourth Step)

After a desired time period (for example, 0.1 to 10 seconds) has elapsed since all the third chamber valves 42b are opened in the third step, the controller 5 controls a shift from the third step to a fourth step. That is, the controller 5 closes all the third chamber valves 42b to inhibit the supply of the $NH_3$ gas to the processing chamber 1. When all the third chamber valves 42b are closed, $NH_3$ gas that is supplied from the reducing gas supply 52 through the reducing gas line 35 is retained in each of the second tank 32a, and thus the pressure in each second tank 32a is increased.

The controller 5 also opens all the fourth chamber valves 44. With this arrangement, the $N_2$ gas at a desired flow rate (for example, 100 to 10000 sccm) is supplied to the processing chamber 1 through the purge gas line 36, and then the $NH_3$ gas is exhausted from the processing chamber 1.

The controller 5 repeats a cycle that includes the first step to the fourth step multiple times (for example, 10 to 1000 cycles) to deposit a TiN film having a desired film thickness. A gas supply sequence and a process gas condition that are used to deposit the TiN film, as illustrated in FIG. 3, are an example, and they are not limiting. Any other gas supply sequence and process-gas condition may be used to deposit the TiN film.

As described above, in the shower plate 3 and the film deposition apparatus 10 including the shower plate 3 according to the present embodiment, the source gas can be retained in each first tank 31a in the shower plate 3, and the reducing gas can be retained in each second tank 32a. With this arrangement, the source gas and the reducing gas retained in the shower plate 3 can be rapidly supplied to the processing chamber 1.

Also, by minimizing a given distance from each chamber valve situated within the shower plate 3 to the substrate W, the length of the gas piping through which each of the source gas and the reducing gas is supplied from a corresponding tank to the processing chamber 1 can be shortened. With this arrangement, effects of residual gas in the piping of each gas line are minimized, thereby enabling increased responsiveness of gas supply.

It should be considered that the shower plate and the film deposition apparatus according to the embodiments disclosed herein are illustrative in all aspects and are not limiting. Various changes and modifications in the form of the embodiments described above can be made without departing from the accompanying claims and their spirit. The aspects described in the embodiments can also apply to any other configuration as long as there is no contradiction. Also, the aspects can be combined as long as there is no contradiction.

The film deposition apparatus in the present disclosure is described using an example of an ALD apparatus that deposits a TiN film, but is not limited thereto. For example, the film deposition apparatus in the present disclosure may include a thermal ALD apparatus, a plasma ALD apparatus, a thermal chemical vapor deposition (CVD) apparatus, a plasma CVD apparatus, or the like. The film deposition apparatus of the present disclosure is not limited to a film deposition apparatus, and may be an etching apparatus.

This International application claims priority to Japanese Patent Application No. 2020-103131, filed Jun. 15, 2020, the contents of which are incorporated herein by reference in their entirety.

REFERENCE SIGNS LIST 1 processing chamber
2 stage
3 shower plate
5 controller
10 film deposition apparatus
30 plate-like member
31 first buffer-tank plate
31a first tank
32 second buffer-tank plate
32a second tank
34 source gas line
35 reducing gas line
36 purge gas line
37 first hole
38 first chamber valve
39 second hole
40 second chamber valve
41a, 41b third hole
42a, 42b third chamber valve

The invention claimed is:

1. A shower plate that includes a plate member provided at a top of a processing chamber, the shower plate comprising:
   first holes communicating with a first flow path in the shower plate;
   first chamber valves provided with the respective first holes;
   second holes communicating with a second flow path in the shower plate;
   second chamber valves provided with the respective second holes;
   third holes provided in the plate member to correspond to the first holes and the second holes; and third chamber valves provided with the respective third holes, wherein the first chamber valves, the second chamber valves, and the third chamber valves are piezoelectric elements, and wherein any individual valve among the first chamber valves and the second chamber valves is connected in series with a third chamber valve among the third chamber valves, such that a flow rate to the processing chamber is controlled based on a difference between an opening degree of the individual valve and an opening degree of the third chamber valve.

2. The shower plate according to claim 1, further comprising a first buffer-tank plate having a shape of a hollow plate and incorporating a vaporization chamber, the first buffer-tank plate being laminated directly on the plate member.

3. The shower plate according to claim 2, further comprising a second buffer-tank plate having a shape of a hollow plate, the second buffer-tank plate being laminated directly on the first buffer-tank plate.

4. The shower plate according to claim 3, wherein the second buffer-tank plate communicates with the second holes, and wherein the second buffer-tank plate is configured to retain a reducing gas that is supplied through the second flow path and the second holes.

5. The shower plate according to claim 3, wherein the second buffer-tank plate communicates with the third holes, and wherein the second buffer-tank plate is configured to supply a reducing gas to the processing chamber at the flow rate through each of the third holes, the flow rate corresponding to the difference between the opening degree of a given second chamber valve among the second chamber valves and the opening degree of the third chamber valve.

6. The shower plate according to claim 3, wherein the second buffer-tank plate is divided into second tanks, and wherein each of the second tanks communicates with at least any one of the second holes and at least any one of the third holes.

7. The shower plate according to claim 2, wherein the first buffer-tank plate communicates with the first holes, wherein the vaporization chamber includes a heating unit, and wherein a source material that is supplied through the first flow path and the first holes is vaporized by the heating unit, and a source gas that is vaporized is retained in the vaporization chamber.

8. The shower plate according to claim 2, wherein the first buffer-tank plate communicates with the third holes, and wherein the first buffer-tank plate is configured to supply a source gas to the processing chamber at the flow rate through each of the third holes, the flow rate of the source gas corresponding to the difference between the opening degree of a given first chamber valve among the first chamber valves and the opening degree of the third chamber valve.

9. The shower plate according to claim 2, wherein the first buffer-tank plate is divided into first tanks, and wherein each of the first tanks communicates with at least any one of the first holes and at least any one of the third holes.

10. A film deposition apparatus comprising:
a processing chamber; and
a shower plate including a plate member, the plate member being provided at a top of the processing chamber,
wherein the shower plate includes
first holes communicating with a first flow path in the shower plate;
first chamber valves provided with the respective first holes;
second holes communicating with a second flow path in the shower plate;
second chamber valves provided with the respective second holes;
third holes provided in the plate member to correspond to the first holes and the second holes; and
third chamber valves provided with the respective third holes,
wherein the first chamber valves, the second chamber valves, and the third chamber valves are piezoelectric elements, and
wherein any individual valve among the first chamber valves and the second chamber valves is connected in series with a third chamber valve among the third chamber valves, such that a flow rate to the processing chamber is controlled based on a difference between an opening degree of the individual valve and an opening degree of the third chamber valve.

* * * * *